United States Patent
Ushikoshi et al.

[11] Patent Number: 5,995,357
[45] Date of Patent: Nov. 30, 1999

[54] CERAMIC MEMBER-ELECTRIC POWER SUPPLY CONNECTOR COUPLING STRUCTURE

[75] Inventors: Ryusuke Ushikoshi, Tajimi; Hideyoshi Tsuruta, Tokai; Tomoyuki Fujii, Nagoya, all of Japan

[73] Assignee: NGK Insulators, Ltd., Japan

[21] Appl. No.: 09/013,045

[22] Filed: Jan. 26, 1998

[30] Foreign Application Priority Data

Jan. 27, 1997 [JP] Japan ................................. 9-012769

[51] Int. Cl.⁶ ................................................ H02N 13/00
[52] U.S. Cl. .................................... 361/234; 269/8
[58] Field of Search .................................. 361/233, 234; 269/8; 279/128; 29/825, 829

[56] References Cited

U.S. PATENT DOCUMENTS

| | | | |
|---|---|---|---|
| 5,382,469 | 1/1995 | Kubota et al. | 428/332 |
| 5,625,526 | 4/1997 | Watanabe et al. | 361/234 |
| 5,781,400 | 7/1998 | Takahashi et al. | 361/234 |
| 5,801,915 | 9/1998 | Kholodenko et al. | 361/234 |
| 5,822,171 | 10/1988 | Shamouilian et al. | 361/234 |

*Primary Examiner*—Jeffrey Gaffin
*Assistant Examiner*—Kim Huynh
*Attorney, Agent, or Firm*—Parkhurst & Wendel, L.L.P.

[57] ABSTRACT

A ceramic member-electric power supply connector coupling structure includes a ceramic member with a hole and is provided with a metallic member therein so as to be partially exposed to the hole. An electric power supply connector and a tubular atmosphere-shielding member are provided in the hole. Further, a stress-mitigating, low heat expansion conductor is provided inside the atmosphere-shielding member and the power supply connector is partially positioned therein. The atmosphere-shielding member is gas-tightly joined to the power supply connector, and the expansion conductor and the tubular atmosphere-shielding member are joined to the metallic member. The coupling structure has high heat and corrosion resistance, high joining strength, and remains highly conductive even at high temperature conditions in an oxidative or corrosive environment.

12 Claims, 11 Drawing Sheets

FIG. 1

FIG_3a

FIG_3b

FIG_10a

FIG_10b

FIG_10c

FIG. 11

CERAMIC MEMBER-ELECTRIC POWER SUPPLY CONNECTOR COUPLING STRUCTURE

BACKGROUND OF THE INVENTION (1) Field of the Invention

The present invention relates to ceramic member-electric power supply connector coupling structure.

(2) Description of Related Art

Nowadays, electrostatic chucks are being used to adsorb and hold semiconductor wafers in transferring, light-exposing, film-forming such as CVD and sputtering, fine processing, washing, etching, dicing, etc. for semiconductor wafers. Dense ceramics are noted for substrates of such electrostatic chucks. Particularly in the semiconductor producing apparatus, a halogen based corrosive gas such as $ClF_3$ is often used as an etching gas or a cleaning gas. In order to rapidly heat and cool the semiconductor wafer while being held by such a substrate, the substrate of the electrostatic chuck is desired to have high heat conductivity. Further, it is desired that the substrate have such heat shock resistance so as not to be destroyed by rapid temperature changes. Dense alumina nitride and alumina have high corrosion resistance against the halogen based corrosion gas mentioned above.

In the field of the semiconductor producing apparatuses, susceptors in with built-in high frequency electrodes for generating plasma have been practically used. In the field of such high frequency electric power generating apparatuses, a metal electrode is buried in a substrate of aluminum nitride or dense alumina. Further, in the field of the semiconductor producing apparatuses, ceramic heaters in which a metallic resistor is buried in a substrate of aluminum nitride or alumina for controlling the temperature of a wafer in each process.

In these apparatuses, it is necessary that the metal electrode be buried in the ceramic substrate made of aluminum nitride or the like, and that the metal electrode be electrically coupled to an external electric power supply connector. However, a coupling portion for this purpose is exposed to a heat cycle between extreme high temperatures and low temperatures in an oxidative atmosphere and further in a corrosive gas atmosphere. Such a joining portion is desired to maintain high joining strength and excellent electric coupling performance for a long time period even under such a bad condition.

The present inventors have continuously studied the coupling structures as mentioned above. For example, a Japanese patent application No. 8-24,835 disclosed that the tip of an electric power supply connector was coupled to a metal electrode in a susceptor with an Al alloy brazing material, a Cu alloy brazing material or a Ni alloy brazing material having high corrosion resistance. Further, JP8-24,836 proposed that a mesh or net metal electrode be buried in an AlN ceramic, while a part of the mesh or net metal electrode be exposed, and the exposed mesh or net portion and the AlN ceramic be both brazed to a tip face of the electric power supply connector.

Although these Japanese patent applications proposed the brazing methods which would ensure high corrosion resistance against the halogen based corrosive gas and the plasma, a specific coupling structure which would maintain high joining strength and excellent conductivity even under exposure to high temperatures and heat cycle in the oxidative atmosphere has not been investigated in detail with respect to the coupling structure for the connector and the metallic electrode.

SUMMARY OF THE INVENTION

It is an object of the present invention to provide a ceramic member-electric power supply connector coupling structure in which a metallic member is buried in the ceramic member and which can maintain high joining strength and excellent conductive performance, even if the coupling structure is subjected to high temperatures and heat cycle in an oxidative atmosphere.

Specifically, the present invention relates to a ceramic member-electric power supply connector coupling structure comprising a ceramic member in which a metallic member is buried and a hole is provided while the metallic member is partially exposed to the hole, an electric power supply connector, a tubular atmosphere-shielding member inserted into the hole, a stress-mitigating, low heat expansion conductor inserted inside the tubular atmosphere-shielding cylinder while the electric power supply connector is partially inserted into the tubular atmosphere-shielding member and upon the low heat expansion conductor, wherein the tubular atmosphere-shielding member is joined to the electric power supply connector, and the low heat expansion conductor and the tubular atmosphere-shielding member are joined to the metallic member.

The present inventors devised the structure in which the ceramic member was provided with the hole to which the buried metallic member was exposed, the tubular atmosphere-shielding hollow member was inserted into the hole, the stress-mitigating low heat expansion conductor and the electric power supply connector were inserted into the tubular atmosphere-shielding member in this order, and the tubular atmosphere-shielding member was joined to the electric power supply connector while the low heat expansion conductor and the tubular atmosphere-shielding member were joined to the metallic member, and the inventors conducted experiments upon it. As a result, the inventors confirmed that the above structure could have higher heat resistance and corrosion resistance and maintain higher joining strength and more excellent conductive performance even under exposure to the heat cycle in the oxidative atmosphere or the corrosive atmosphere, as compared with the other structures. The present invention has been accomplished based on this confirmation.

The low heat expansion conductor has a low heat expansion which is higher than that of the ceramic member but lower than that of the connector, and functions to mitigate stress between the connector and the ceramic member which would occur if the connector is directly joined to the ceramic member. The atmosphere-shielding member is made of a heat-resistive metal, and is designed to completely shield the low heat expansion conductor from the surrounding atmosphere.

These and other objects, features and advantages of the invention will be appreciated upon reading of the description of the invention when taken in conjunction with the attached drawings, with the understanding that some modifications, variations and changes of the same could be easily made by the skilled person in the art.

BRIEF DESCRIPTION OF THE DRAWINGS

For a better understanding of the invention, reference is made to the attached drawings, wherein.

DETAILED DESCRIPTION OF THE INVENTION

In the following, various embodiments of the ceramic member-electric power supply connector coupling structure according to the present invention will be explained with reference to the drawings. The function and effects of the present invention will be made clearer from the following explanation.

Figure 1:
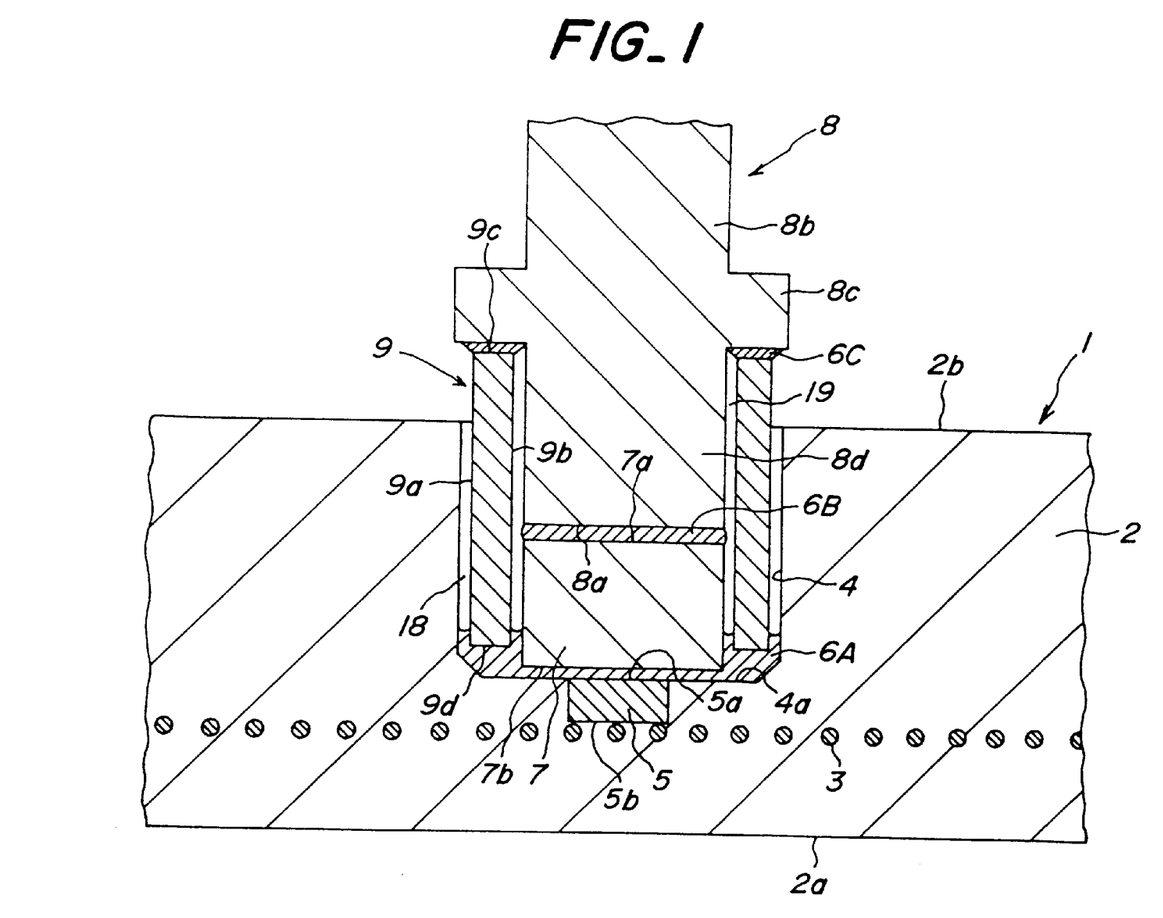
FIG. 1 is a sectional view of an embodiment of the ceramic member-electric power supply connector coupling structure according to the present invention.
Figure 3A:
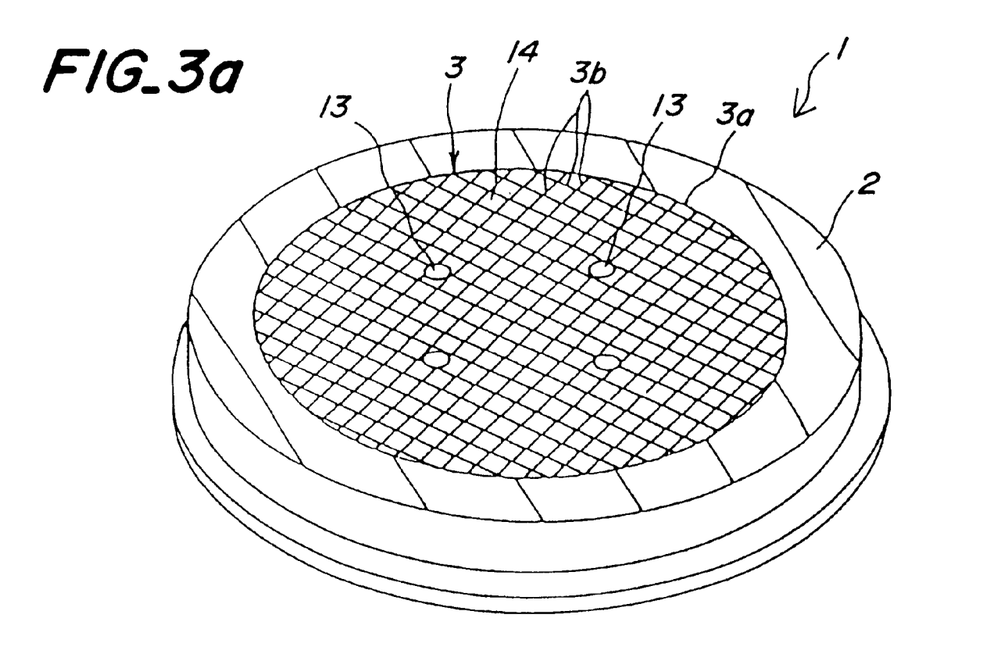
FIG. 3(a) is a perspective view illustrating a plasma-generating electrode in the state that an upper portion of the coupling structure is removed to show the electrode and FIG. 3(b) is a perspective view of a netlike electrode made of a metal net or a metal mesh.
Figure 3B:
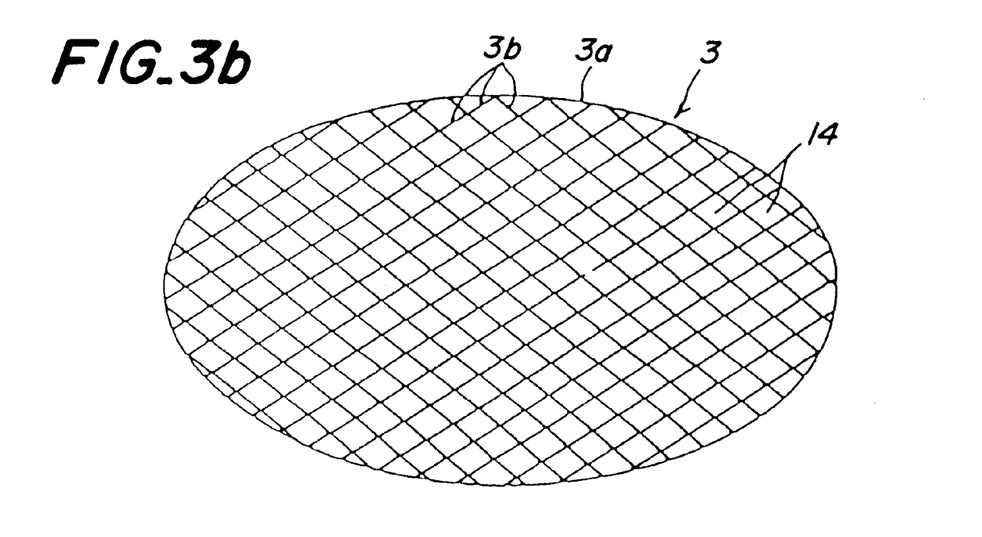

FIG. 1 is a sectional view of an embodiment of the ceramic member-electric power supply connector coupling structure according to the present invention. FIG. 3(a) is a perspective view of a plasma-generating electrode in the state that an upper portion of the coupling structure is removed to show the electrode and FIG. 3(b) is a perspective view of an electrode 3 made of a metal net or a metal mesh.

The electrode 3 made of the metal net is buried in an almost discoidal ceramic substrate 2 having a semiconductor wafer-placing face 2a and a rear face 2b. In the substrate 2 are provided holes 13, at given locations, through which are passed pins to move up and down the semiconductor wafer. The electrode 3 is made of the metal net shown in FIGS. 3(a) and 3(b), and is constituted by a round frame wire 3a and cross wires 3b stretched inside the frame wire 3a while meshes 14 are formed among them.

A blind hole 4 is formed in the substrate 2 on the side of the rear face 2a, and the netlike electrode 3 is buried in the substrate 2. A sintered shaped metallic powdery body 5 is also buried in the sintered powdery body 5 in such a state that one (5a) of opposite surfaces of the sintered body 5 is exposed to the bottom face 4a of the hole 4, while the other surface 5b of the sintered body 5 contacts the metal electrode 3.

In this embodiment, a tubular atmosphere-shielding member 9 is inserted into the hole 4 of the ceramic member 2 such that a slight gap 18 remains between the outer peripheral face 9a of the atmosphere-shielding member 9 and the inner peripheral face of the hole 4. A low heat expansion conductor 7 having, for example, a discoidal shape is placed in a lower inner space of the atmosphere-shielding body 9.

The lower surface 7b of the low heat expansion conductor 7 is gas-tightly joined to the bottom surface 4a of the hole 4 and the upper surface 5a of the sintered shaped powder body 5 with a conductive joining layer 6A made of preferably a brazing material. The lower surface 9d of the atmosphere-shielding body 9 is joined to the bottom surface 4a of the hole 4 with the conductive joining layer 6A.

An electric power supply connector 8 includes a connector body 8b outside a plasma generating electrode device 1, an annular flange portion under the connector body 8b and a tip portion 8d under the annular flange 8c. The tip portion 8d of the connector 8 is placed in the atmosphere-shielding body 9 such that a slight gap 19 remains between the inner peripheral surface 9a of the atmosphere-shielding body 9 and the low heat expansion conductor 7 and the tip portion 8d of the connector 8. A conductive joining layer 6C preferably made of a brazing material is gas-tightly formed between the upper surface 9c of the atmosphere-shielding member 9 and the lower surface of the flange portion 8c of the connector 8, whereas a conductive joining layer 6B is gas-tightly formed between the tip surface 8a of the connector 8 and the upper face 7a of the low heat expansion conductor 7.

Figure 2:
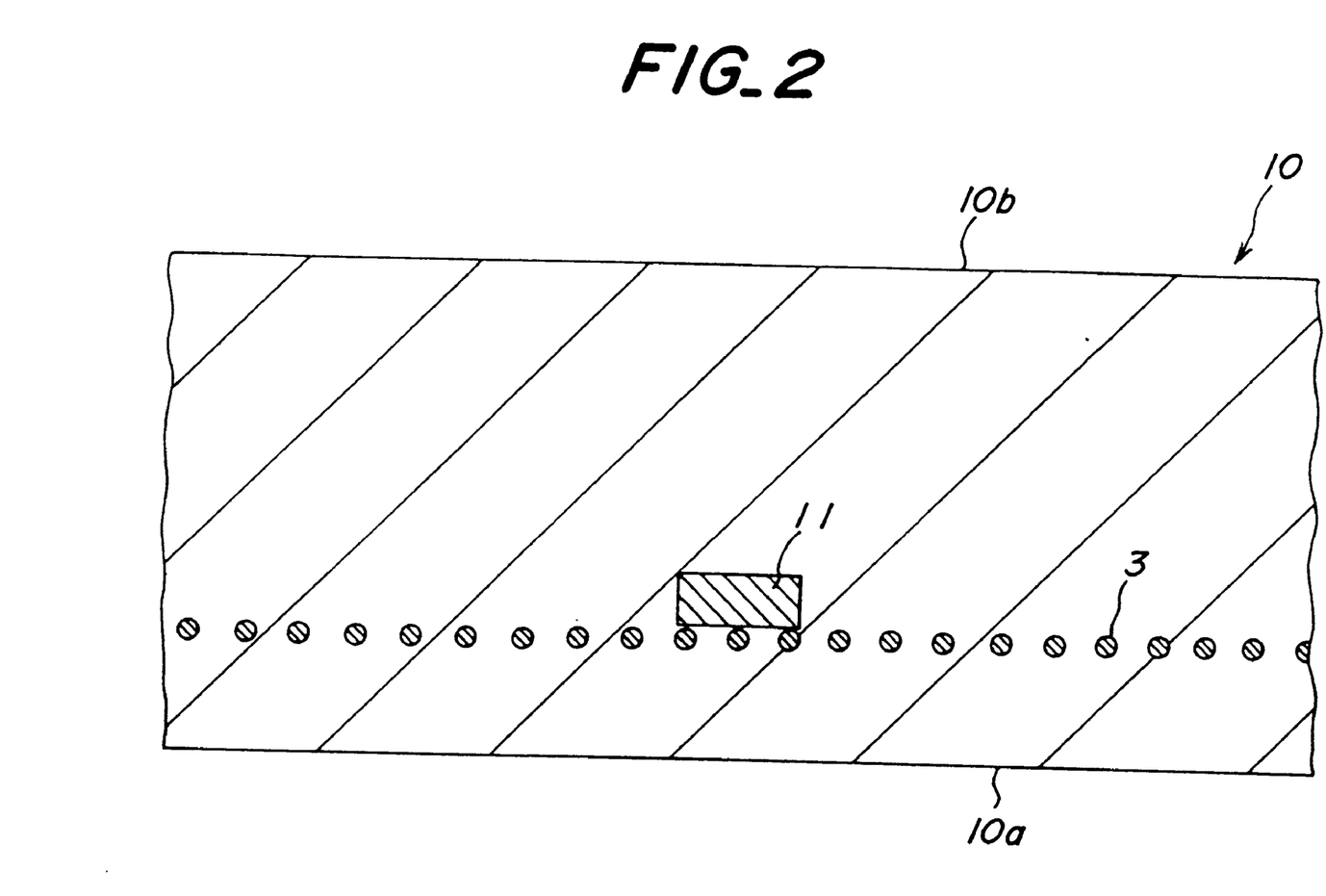
FIG. 2 is a sectional view of a molded body in which a metal electrode and a sintered shaped powdery body are buried.

In order to produce the plasma generating electrode device having such a coupling structure, a molded body 10 made of a ceramic material as shown in FIG. 2 is preferably prepared, and fired. In this molded body 10, a netlike metal electrode 3 and a molded metallic powder 11 to form a sintered shaped powdery body are buried as shown. In FIG. 2, reference numerals 10a and 10b correspond to the semiconductor-placing face 2b and the rear face 2b of the ceramic member 2, respectively. When the molded body 10 is fired, the molded powdery body 11 is simultaneously sintered to give the sintered shaped powdery body 5. The hole 4 is formed in the fired molded body 10 from the side of the rear face 2b.

In the present invention, the low heat expansion conductor means a conductor made of a material having a heat expansion rate of not more than $8.0 \times 10^{-6}/°C$. at 40° C. or less. As the material for the low heat expansion conductor, molybdenum, tungsten, molybdenum-tungsten alloy, tungsten-copper-nickel alloy, and iron-cobalt-nickel alloy (sold under the trademark KOVAR) are specifically preferred. As a material for the atmosphere-shielding member, pure nickel, nickel based heat-resistive alloy, gold, platinum, silver and alloys thereof are preferred. As a material for the connector, a metal having high corrosion resistance against the atmosphere is preferred. More specifically, pure nickel, nickel based heat alloy, gold, platinum, silver and alloys thereof are preferred.

As the function and effects of the present invention will be further explained with reference to mainly FIG. 1. As a material for the connector 8, an acid-resistant metal is preferred. In general, such a metal has a large heat expansion rate, and causes large stress between a ceramic member due to difference in thermal expansion therebetween. For this reason, if the connector 8 is directly brazed to the ceramic substrate 2, joining strength tends to decrease due to the difference in thermal expansion between them. In order to improve this, according to the present invention, the heat expansion conductor 7 is placed between the connector 8 and the ceramic member 2 so that stress caused between the connector and the ceramic member having a heat expansion rate lower than that of the connector but higher than that of the ceramic member may be mitigated.

However, the metal having a lower heat expansion rate (molybdenum, tungsten, molybdenum-tungsten alloy, tungsten-copper-nickel alloy, etc.) is generally likely to be oxidized. Therefore, if the low heat expansion conductor 7 contacts the oxidative atmosphere at a high temperature, the low heat expansion conductor 7 is instantly oxidized, so that joining strength drops and an electric resistance rises. Accordingly, it was difficult to use the metal having a lower heat expansion rate as a material for the low heat expansion conductor 7.

It is considered that if the low heat expansion conductor 7 is alternatively made of an insulating, stress-mitigating material such as an insulating ceramic material including aluminum nitride, there does not occur the problem that the low heat expansion conductor 7 is oxidized. However, in this case, the stress-mitigating material is outside the current flowing passage, and the stress mitigating material cannot be electrically connected to the metallic member inside the ceramic substrate. Therefore, the amount of the electric power to be supplied to the metallic member inside the substrate comes to be limited.

To the contrary, according to the structure of the present invention, the area of the connection between the low heat expansion conductor 7 and the metal member 5 is large, and the low heat expansion conductor 7 joins the current flow passage at this connection. Consequently, large current, for example, 30 amperes, can be easily flown.

Also, the present inventors placed and installed the tubular atmosphere-shielding member 9 in the hole 4 of the ceramic member 2, while the above low heat expansion conductor 7 is positioned in the lower portion of the inner space of the atmosphere-shielding member 9 and the tip portion 8*d* of the connector 8 is inserted above the low heat expansion conductor within the atmosphere-shielding member 9.

By so doing, the peripheral surface side of the low heat expansion conductor 7 is completely surrounded and protected by the atmosphere-shielding member 9. In addition, the tip portion of the connector 8 is placed on the low heat expansion conductor, and is surrounded by the atmosphere-shielding member 9. Consequently, the length of the oxidative atmosphere-invading passage up to the low heat expansion conductor 7 becomes very large. At the same time, the connector 8 is joined to the atmosphere-shielding member 9 with the conductive joining layer 6C and this joined portion is gas-tightly kept. Thus, the present inventors succeeded in more completely ensure the isolation of the low heat expansion conductor 7 from the oxidative atmosphere.

Furthermore, according to this embodiment, there are two current flow passages: one being a current flow passage from the tip portion 8*d* of the connector 8, the conductive joining layer 6B, the low heat expansion conductor 7, the conductive joining layer 6A to the sintered shaped powdery body 5, and the other being a current flow passage from the flange portion 8*c* of the connector 8, the conductive joining layer 6C, the atmosphere-shielding member 9, the conductive joining layer 6A to the sintered shaped powdery body 5. The amount of the electric power supplied to the electrode 3 can be more increased and stabilized.

In the present invention, the metallic electrode is buried in the ceramic substrate in the form of a planar metallic bulky member. The "planar metallic bulky member" means, for example, a planar, integral metallic shaped body as shown in FIGS. 3(*a*) and 3(*b*) and FIGS. 4(*a*) to 4(*c*) instead of a wire or a planar body arranged in a spiral or zigzag form.

Since the metal electrode is simultaneously fired with the molded body made of ceramic powder such as alumina powder or aluminum nitride powder, the metal electrode is preferably made of a high melting point metal. As such a high melting point metal, tantalum, tungsten, molybdenum, platinum, rhenium, hafnium and alloys thereof may be recited. From the standpoint of preventing contamination of the semiconductors, tantalum, tungsten, molybdenum, platinum and alloys thereof are preferred.

As such planar bulky members, the following may be recited.

(1) A planar bulky member made of a thin plate
(2) A planar bulky electrode member in which a number of small openings are formed. This includes a bulky member made of a planar material having numerous small holes, and a netlike bulky member. As the planar member having numerous small holes, a punched metal may be recited. If the bulky member is made of a punched metal of a high melting point metal, it is difficult and highly costly to form a number of the small holes in the high melting point metal plate by punching, because the high melting point metal has large hardness. In this respect, if the bulky member is made of a metal net, wires made of a high melting point metal are easily available, and the metal net can be easily produced by knitting the wires.

No particular limitation is posed upon the mesh shape and the wire diameter of such a metal net. However, metal nets ranging from a metal net having a wire diameter of 0.03 mm and 150 meshes to a metal net having a wire diameter of 0.5 mm and 6 meshes could be used with no particular problem. Further, the widthwise sectional shape of the wires constituting the metal net may be elliptical, rectangular, variously rolled shapes besides a round shape. One mesh means one wire per one inch.

Figure 4A:
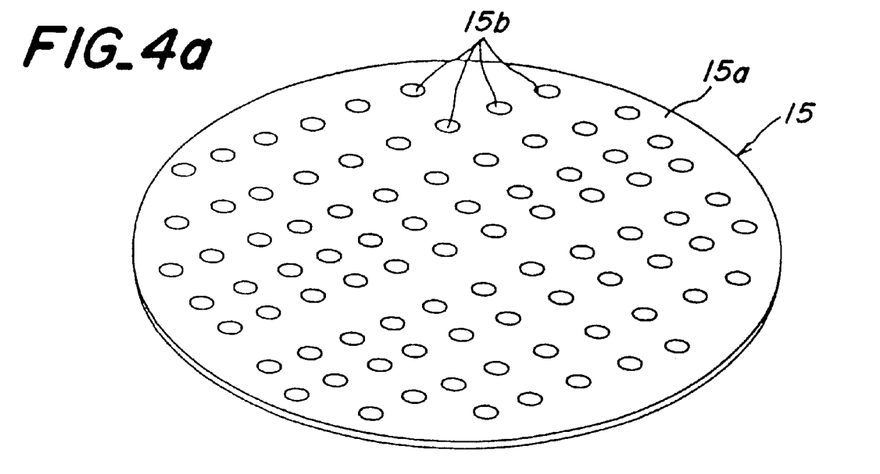
FIGS. 4(a), 4(b) and 4(c) are perspective views of preferred embodiments of the metal electrode to be buried in a ceramic member.
Figure 4B:
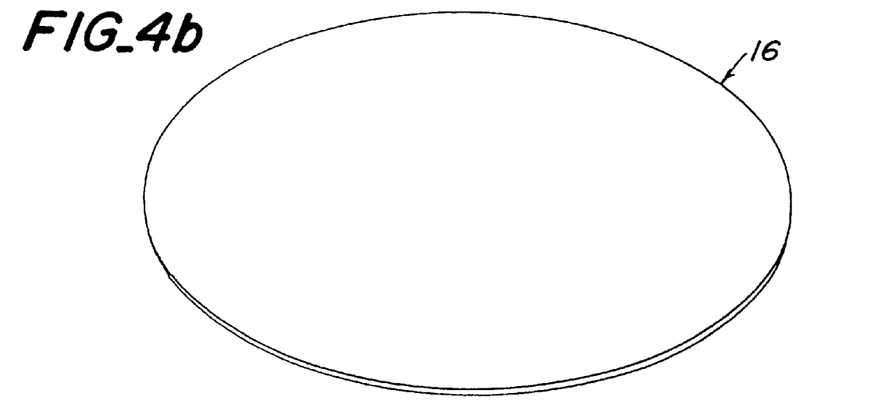

FIG. 4(*a*) is a perspective view of a punched metal 15 to be used as the metal electrode. The punched metal 15 has a round shape in which numerous holes 15*b* are formed in a round planar plate 15*a* in a grid pattern. FIG. 4(*b*) is a perspective view of a round thin plate 16 to be used as the metal electrode.

Figure 4C:
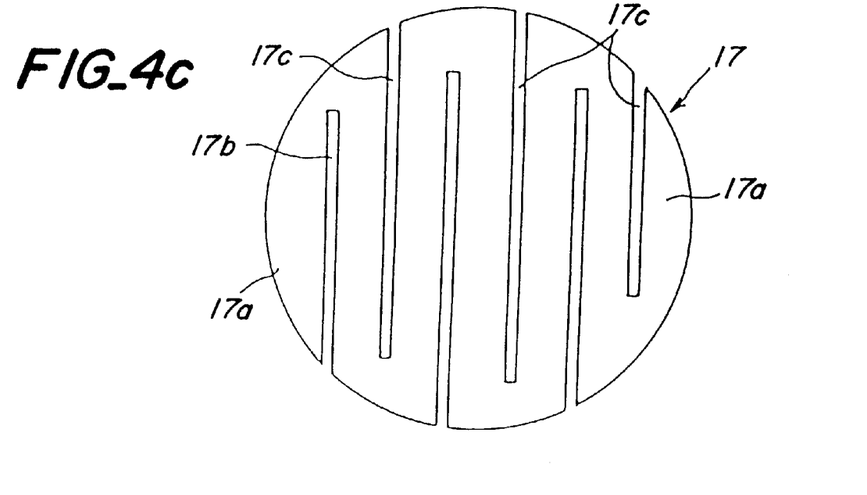

FIG. 4(*c*) is a plane view of a thin plate 17 to be used as the metal electrode. In the thin plate 17 are formed a total of six rows of slender straight cuts 17*b*, 17*c* parallel to one another. Three cuts 17*b* of them are opened at a lower side of FIG. 4(*c*), whereas the remaining three cuts 17*c* are opened at an upper side. These cuts 17*b* and 17*c* are alternatively arranged. As a result of employing such a configuration, a slender conductive path is formed by this thin plate. Terminals are connected to opposite ends 17*a* of the conductive path.

The ceramic member-electric power supply connector coupling structure according to the present invention may be applied to a device to be installed in the semiconductor producing apparatus in which the halogen-based corrosive gas is used as a film-forming gas or an etching gas.

As such devices, mention may be made, by way of example, a heater in which a resistive heating element is buried in a ceramic substrate, an electrostatic chuck in which an electrostatically chucking electrode is buried in a ceramic substrate, an electrostatic chuck-provided heater in which a resistive heating element and an electrostatically chucking electrode are buried in a ceramic substrate, a radio frequency wave generating electrode device in which a plasma generating electrode is buried in a ceramic substrate, and a radio frequency wave generating electrode device in which a plasma generating electrode and a resistive heating element are buried in a ceramic substrate.

In the present invention, the conductive joining layer is not limited to any particular material. However, a material having high gas-tightness and small electric resistance is preferred. From this point of view, a metallic brazing material is particularly preferred. The chemical composition of such a brazing material is not particularly limited.

However, a brazing material which exhibits excellent joining force or wettability for the ceramic member itself is preferable. If the substrate of the ceramic member is made of dense alumina or aluminum nitride, a brazing material composed mainly of one kind of Cu, Ni, Ag and Al and including 0.3 to 20 wt % of an active metal selected from Mg, Ti, Zr and Hf and not more than 50 wt % of a third component is preferably used. In an application where corrosion resistance is required against the halogen based corrosive gas, it is better to not use an Ag-based brazing material because its small corrosion resistance.

As the third component, at least one of Si, Al and In is preferably used, because such elements will not influence the main component. Particularly, a brazing material composed mainly of Al is preferably used, because it effects joining at a low temperature to cause smaller heat stress after joining.

If the compounding amount of the active metal is less than 0.3 wt %, wettability so drops that effective joining may not be realized in some cases. On the other hand, if it is more than 20 wt %, the thickness of a reaction layer at a joining interface is so large that crack may be formed in some cases. Therefore, this compounding amount is preferably 0.3 to 20 wt %. If the total compounding amount of the third component(s) is more than 50 wt %, much intermetallic compound(s) is formed so that the joining interface may be cracked in some cases. Therefore, the total compounding amount is preferably not more than 50 wt %. Such third components may not be contained.

The content of the metal as the main component of the brazing material is a value of 100 wt % minus the content of the active metal component and the third component when the total weight of the brazing material is taken as 100 wt %.

Figure 5:
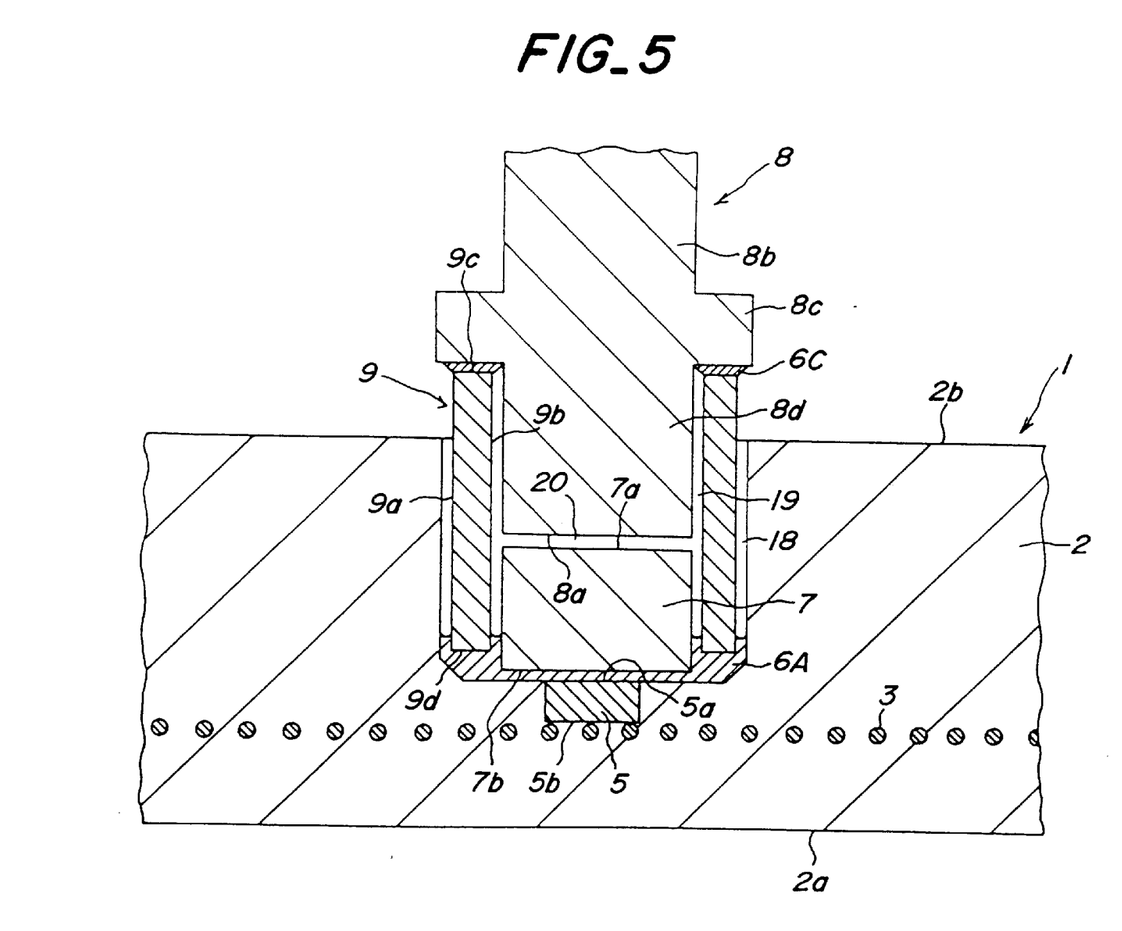
FIG. 5 is a sectional view of another embodiment of the ceramic member-electric power supply connector coupling structure according to the present invention.
Figure 6:
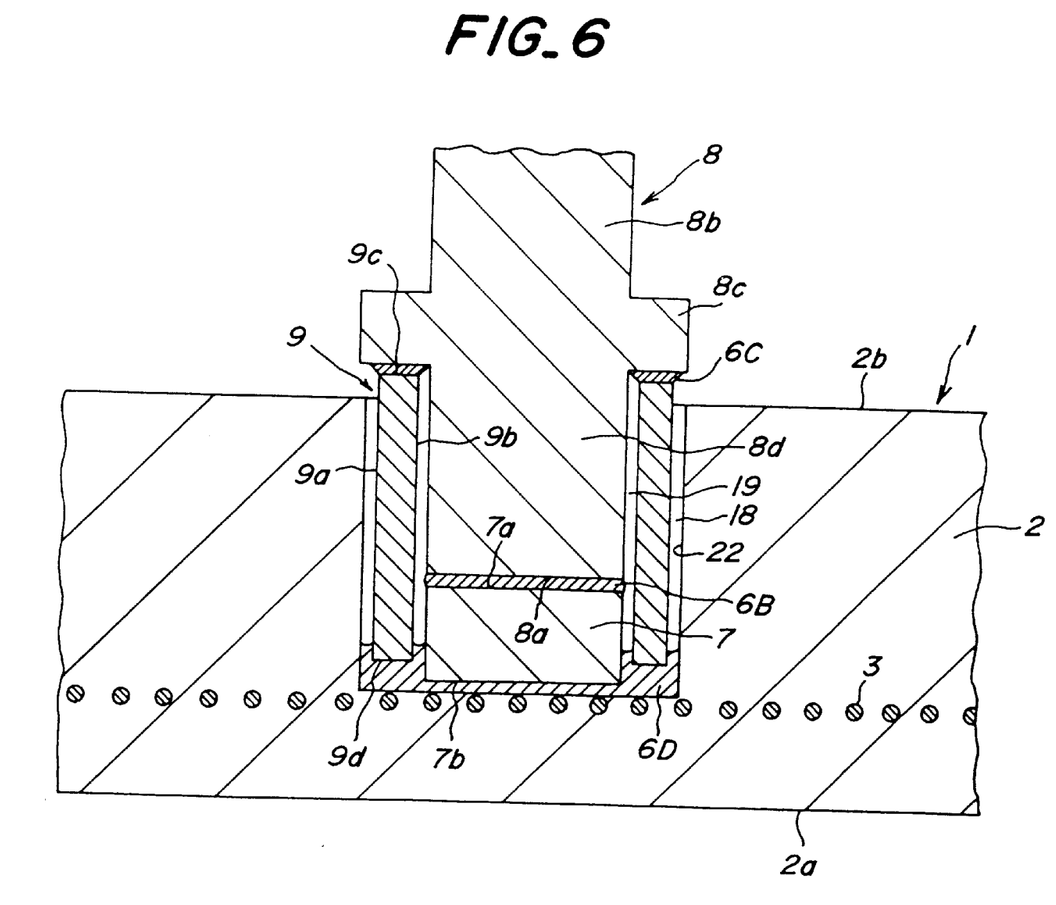
FIG. 6 is a sectional view of a further embodiment of the ceramic member-electric power supply connector coupling structure according to the present invention.

In the present invention, it is preferable that the low heat expansion conductor is electrically joined to the connector as in the embodiment of FIG. 1. However, it is not essential to electrically connect them. FIG. 5 is a sectional view of a coupling structure of such an embodiment. In FIGS. 5 and 6, the constituent parts shown in FIG. 1 are denoted by the same reference numerals, and their explanation is omitted.

In the embodiment of FIG. 5, a gap 20 is formed between a tip portion 8d of a connector 8 and a low heat expansion conductor 7, which are not joined with a conductive joining layer. However, in this case, the low heat expansion conductor 7 is directly joined to a metallic member 5 through a conductive joining layer 6A. Since this joining portion has a low electric resistance, large current can be fed to the metallic member.

In an embodiment of FIG. 6, no sintered shaped powdery body 5 is used. That is, a hole 22 is formed, opening at a side of a rear face 2b of a substrate 2, and a part of a netlike electrode 3 is exposed to this hole 22. The netlike electrode 3 is joined to both the low heat expansion conductor 7 and the bottom face 9d of the atmosphere-shielding member 9 with a conductive joining layer 6D.

However, interposing the sintered shaped powdery body between the metallic electrode inside the ceramic substrate and the low heat expansion conductor as shown in FIG. 1 is preferable, because the length of the transmitting path for the oxidizing gas or the corrosive gas to reach the metal electrode is greater.

In the embodiments as shown in FIGS. 1, 5 and 6, the gap between the inner peripheral surface of the hole 4, 22 and the outer peripheral surface 9a of the atmosphere-shielding member 9 is preferably not less than 0.2 mm. The gap 19 between the inner peripheral surface 9b of the atmosphere-shielding member 9 and the low heat expansion conductor 7 and the tip portion 8d of the connector 8 is preferably not less than 0.01 mm. If the gap 18 is less than 0.2 mm and/or the gap 19 is less than 0.01 m, the brazing material is likely to rise in the gap(s) due to the capillary action. If the brazing material rises in such a gap, the ceramic substrate or the brazing material is cracked. The reason why the lower limit of the gap 18 is 0.2 mm and that of the gap 19 is 0.01 mm is that if this gap is sealed, this gap gives resistance against the capillary force because the gap is closed at both the joints 6A and 6B.

It is more preferable that both the gaps 18 and 19 are not more than 1.0 mm.

Figure 7:
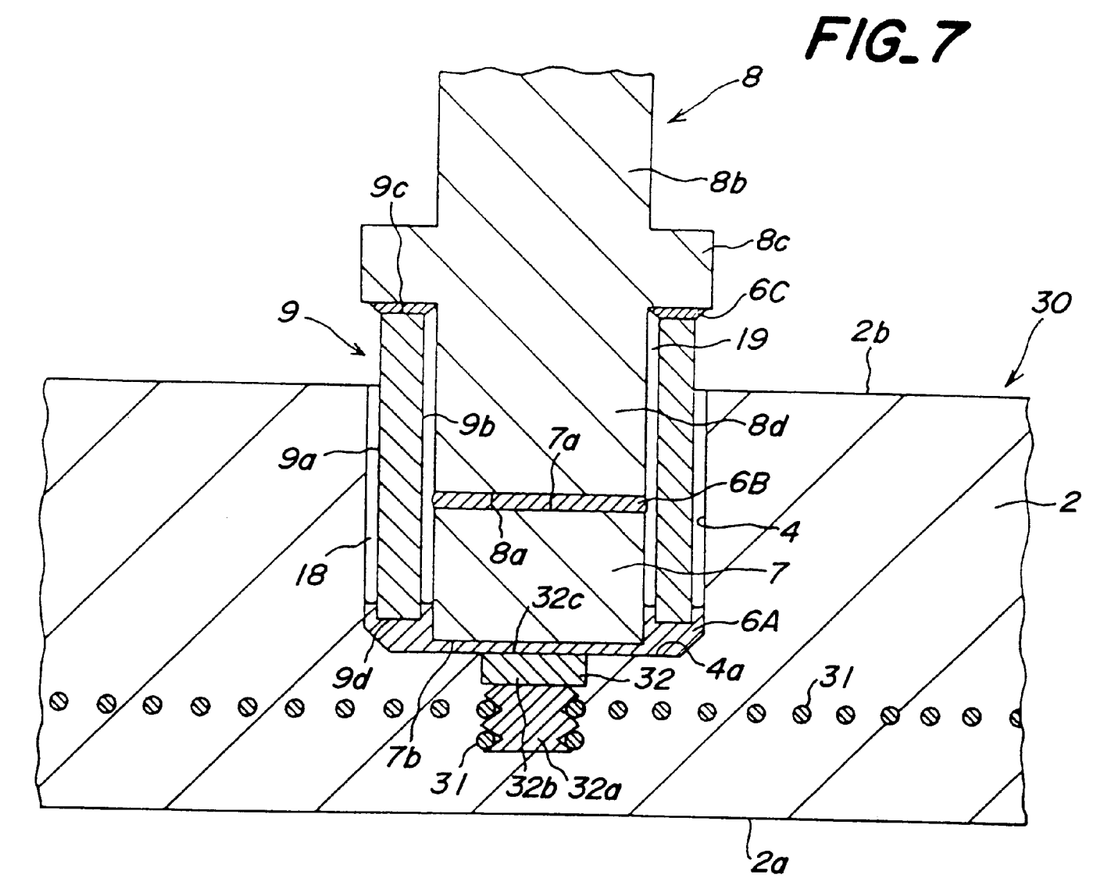
FIG. 7 is a sectional view of a still further embodiment of the ceramic member-electric power supply connector coupling structure according to the present invention in which a dense body is buried in a substrate.
Figure 8:
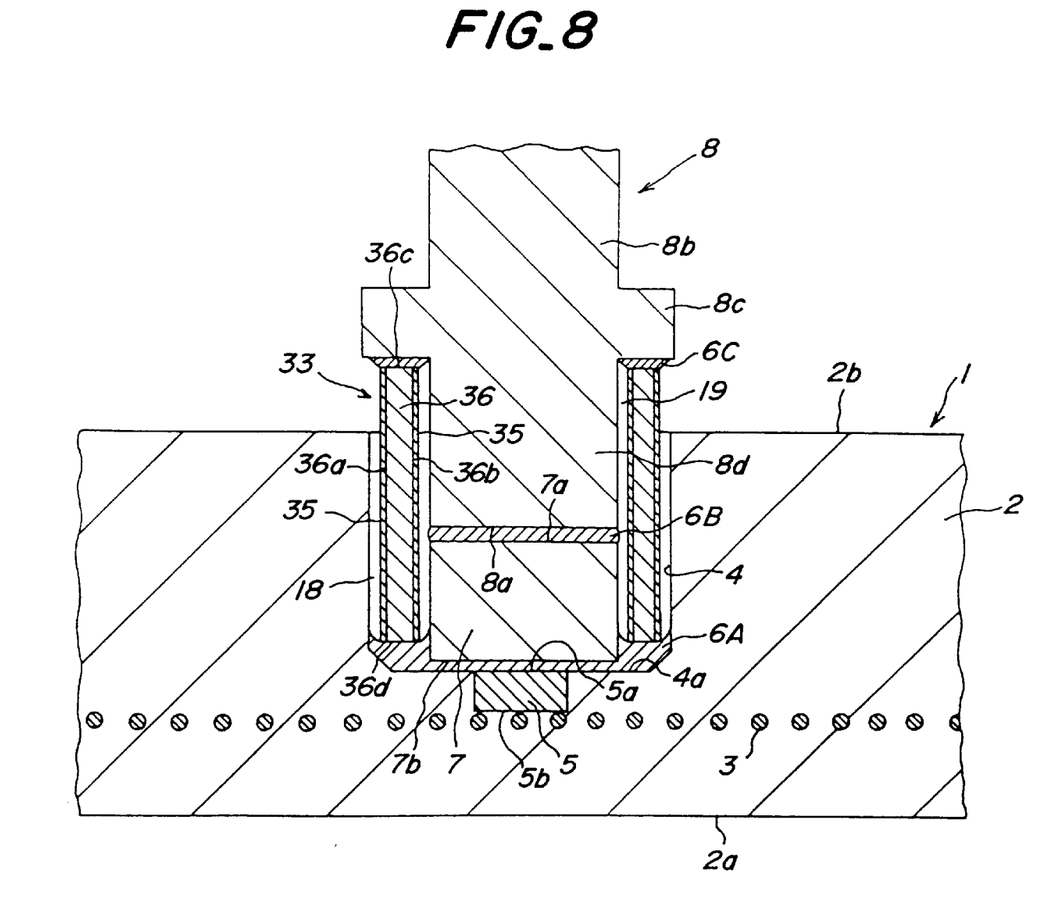
FIG. 8 is a sectional view of a still further embodiment of the ceramic member-electric power supply connector coupling structure according to the present invention which employs an atmosphere-shielding member 35 provided with an oxide film 35.
Figure 9:
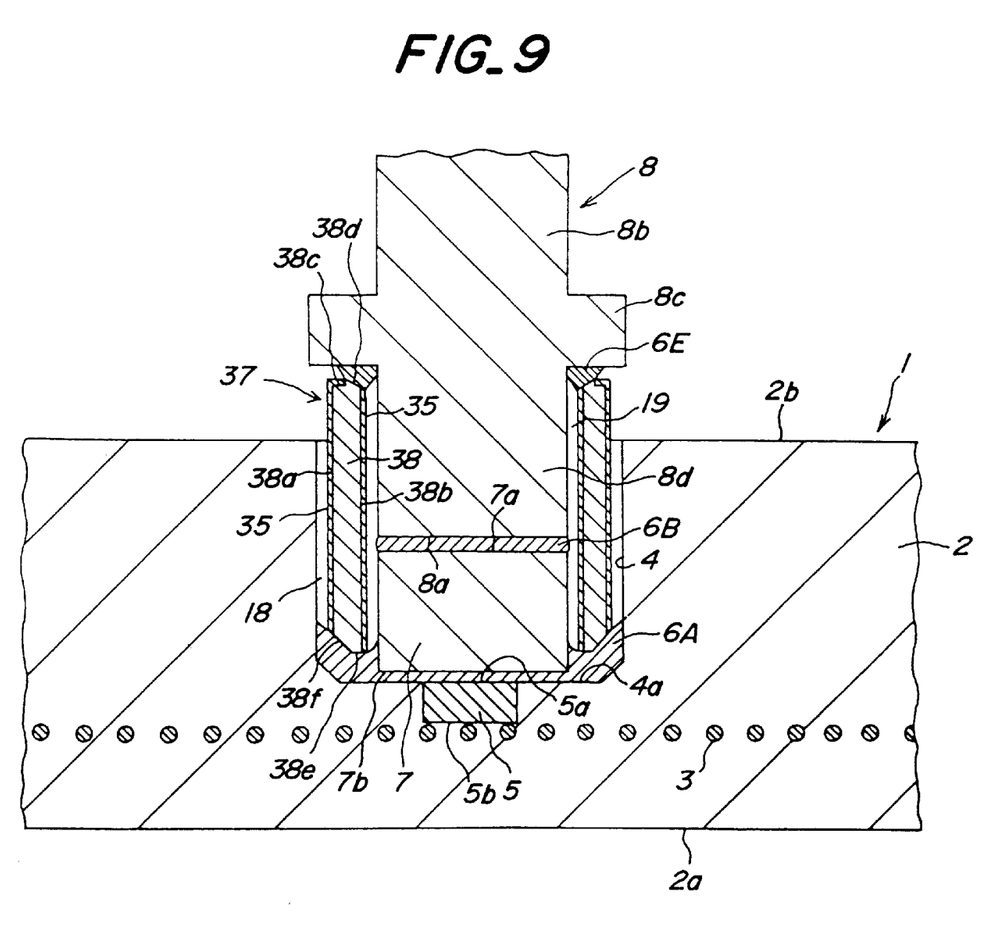
FIG. 9 is a sectional view of a still further embodiment of the ceramic member-electric power supply connector coupling structure according to the present invention which employs an atmosphere-shielding member 35 provided with an oxide film 35.

FIG. 7 is a sectional view of an embodiment in which a metal electrode and a dense body made of a low heat expansion metal are buried in a ceramic substrate. In FIGS. 7, 8 and 9, the constituent parts shown in FIG. 1 are denoted by the same reference numerals, and their explanation is omitted.

In this embodiment, for example, a metal electrode 31 having a coiled shape or the like is buried in the substrate 2 of a ceramic heater 30. A coil-shaped linear heater is a preferred embodiment of the metal electrode. The dense body 32 is buried at a lower side of a bottom face of a receiving hole 4 of the substrate 2. The dense body 32 includes a male screw portion 32a and a main body 32b, and an upper face 32c of the main body 32b is electrically connected to a low heat expansion conductor 7 via a conductive joining layer 6A. The coiled heater 31 is wound around the male screw portion 32a.

Coupling structures in embodiments shown in FIGS. 8 and 9 are similar to that in FIG. 1, except that the structure of the atmosphere-shielding member differs between them. In the coupling structure of FIG. 8, an atmosphere-shielding member 33 includes a main body 36 made of a heat-resistive metal as mentioned above and an oxide film 35 covering the outer and inner surfaces 36a and 36b of the main body 36. This heat-resistive film is formed by heating the main body of the atmosphere-shielding member 33). The metal constituting the main body is exposed at upper and lower faces 36c and 36d of the main body.

The exposed upper surface 36c of the main body 36 is joined to a connector 8 through a conductive joining layer 6C. On the other hand, the lower surface 36d of the main body 36 is joined to a sintered shaped powdery body 5 via a conductive joining layer 6A. Since the oxidized film exhibits lower wettability for the brazing material as compared with the corrosion-resistive metal constituting the main body 36, the brazing material is less likely to rise along the inner and outer peripheral surfaces of the atmosphere-shielding member 33, so that the brazing material tends to rise along the peripheral surface of the receiving hole 4. Due to this, the conductive joining layer 6A in the receiving hole 4 may have a fillet shape causing less residual stress. Further, reliability in strength can be enhanced by employing a screwing engagement structure between the atmosphere-shielding member 33 and the receiving hole 4.

In a coupling structure of FIG. 9, an atmosphere-shielding member 37 includes a main body 38 made of a heat-resistant metal and an oxidized film 35 as mentioned above. Outer and inner peripheral surfaces 38a and 38b and an upper flat surface 38c are covered with the oxidized film 35. The metal constituting the main body 38 is exposed at an upper inclined surface 38d, a lower flat surface 38e and a lower inclined surface 38f of the main body 38.

The exposed upper inclined surface 38d of the main body 39 is joined to a cable (connector) 8 via a conductive joining layer 6E, whereas the lower inclined surface 38f and the lower flat surface 38e of the main body 38 are joined to a sintered shaped powdery body 5 via a conductive joining layer 6A.

Figure 10A:
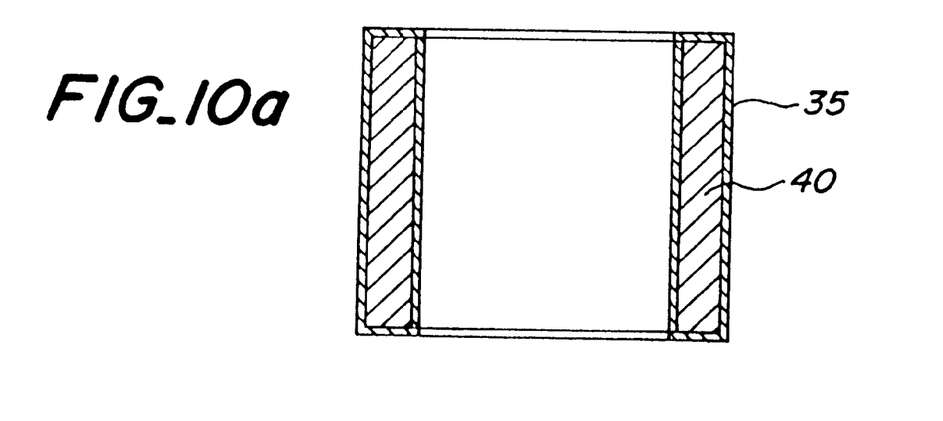
FIGS. 10(a), 10(b) and 10(c) are sectional views for illustrating a process for producing the atmosphere-shielding member.
Figure 10B:
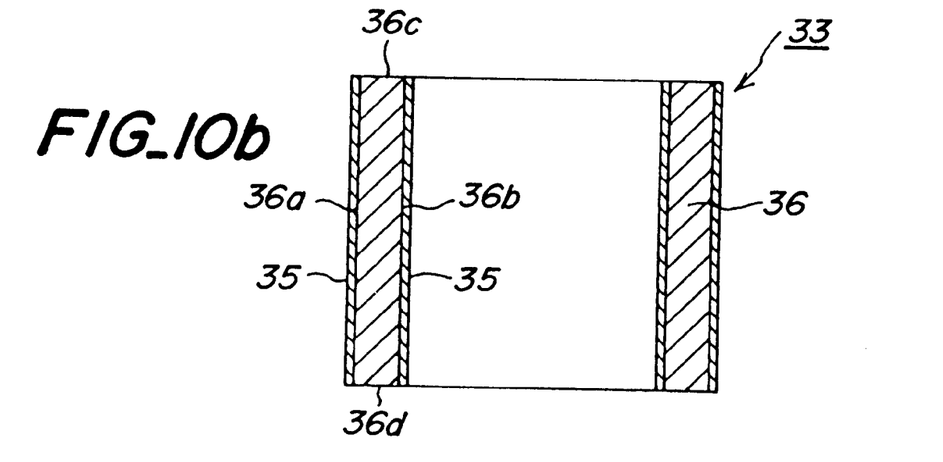
Figure 10C:
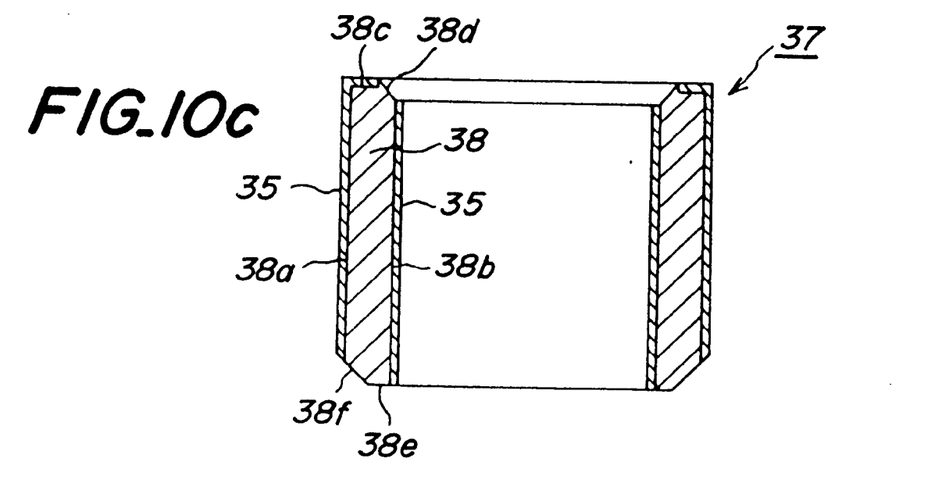

In order to produce the atmosphere-shielding members according to the embodiments of FIGS. 8 and 9, the following method, which will be explained with reference to FIGS. 10a to 10c, is preferred. First, as shown in FIG. 10a, a tubular member 40 made of the above heat-resistant metal is prepared, and an oxidized film 35 is formed over the entire surface of the tubular member 40 by heating the tubular member 40 in an oxidizing atmosphere.

Next, exposed surfaces 36c and 36d shown in FIG. 10(b) are formed by grinding opposite end surfaces of the main body 40.

Exposed surfaces 38d, 38e and 38f shown in FIG. 10c can be formed by grinding the tubular member in FIG. 10a. In this case, the oxidized film 35 remains on the upper flat surface 38c, the outer peripheral surface 38a and the inner peripheral surface 38b of the main body 38.

The present invention will be explained in more detail with reference to the following specific example and comparative example.

EXAMPLE

A coupling structure having a configuration as shown in FIG. 8 having an electrode of FIG. 3 was produced. A preliminarily molded body 1 having a discoid shape as shown in FIG. 2 was prepared by uniaxially press molding aluminum nitride powder.

As the metallic electrode, a metal net made of molybdenum was used, which had 0.12 mm-diameter molybdenum wires knitted at a density of 50 wires per inch. This metal net was buried in the preliminarily molded body. A molded body 11 obtained by molding molybdenum powder having particle diameters of 1–100 μm was also buried in the molded body 10.

This molded body 10 was placed in a mold in the state that the molded body 10 was sealed in a carbon foil, and sintered at a temperature of 1950° C. under pressure of 200 kg/cm² for a retaining time of 2 hours by hot press, thereby obtaining a sintered body having a relative density of not less than 98.0%.

A hole 4 was formed in the thus obtained sintered body from a rear face side by a machining center, thereby producing a plasma generating electrode device, which had a dimension: 200 mm diameter and 8 mm thickness.

On the other hand, an atmosphere-shielding member 33 was prepared as shown in FIGS. 10a to 10b. More specifically, a tubular member 40 made of nickel was prepared, and thermally treated at 1000° C. in air for 2 hours, thereby forming a nickel oxide film 35 on it. The resulting tubular member was ground, thereby obtaining the atmosphere-shielding member 33 as shown in FIG. 10b.

A 5 μm-thick titanium film, a 200 μm-thick silver film and a secondary 5 μm titanium film were successively laminated and placed upon the inner side of the hole 4. Then, a low heat expansion conductor 7 made of molybdenum and the above atmosphere-shielding member 33 were placed on the laminate. Next, a 5 μm-thick titanium film was placed on the low heat expansion conductor 7, a 400 μm was placed on the titanium film, and a tip portion 8d of a connector 8 made of nickel was placed on the silver film. A 200 μm-thick silver film was placed between an upper face 36c of the atmosphere-shielding body 33 and a flange portion 8c of the connector 8. The thus obtained assembly was thermally treated at 960° C. to 1000° C. for 10 minutes, thereby obtaining the coupling structure as shown in FIG. 8.

With respect to the thus obtained coupling structure, a tensile fracture load was measured to be 175±29 kgf, and a bending fracture torque measured to be 22±22.3 kgf·cm (n=2) (n: number of test pieces, the figure is an average value thereof).

This coupling structure was subjected to heat cycle between 100° C. and 700° C. 50 times under the condition that a heating rate and a cooling rate were both set at about 200° C./min, and then its tensile fracture load was measured to be 157±17 kgf (n=4). The bending fracture torque of the coupling structure after the heat withstanding test was measured to be 20±5 kgf·cm (n=2).

After a heat withstanding test in which the coupling structure was held at 700° C. for 24 hours, its tensile fracture load was measured to be 101±63 kgf (n=5), and its bending fracture torque measured to be 18±2 kgf·cm (n=2).

COMPARATIVE EXAMPLE

Figure 11:
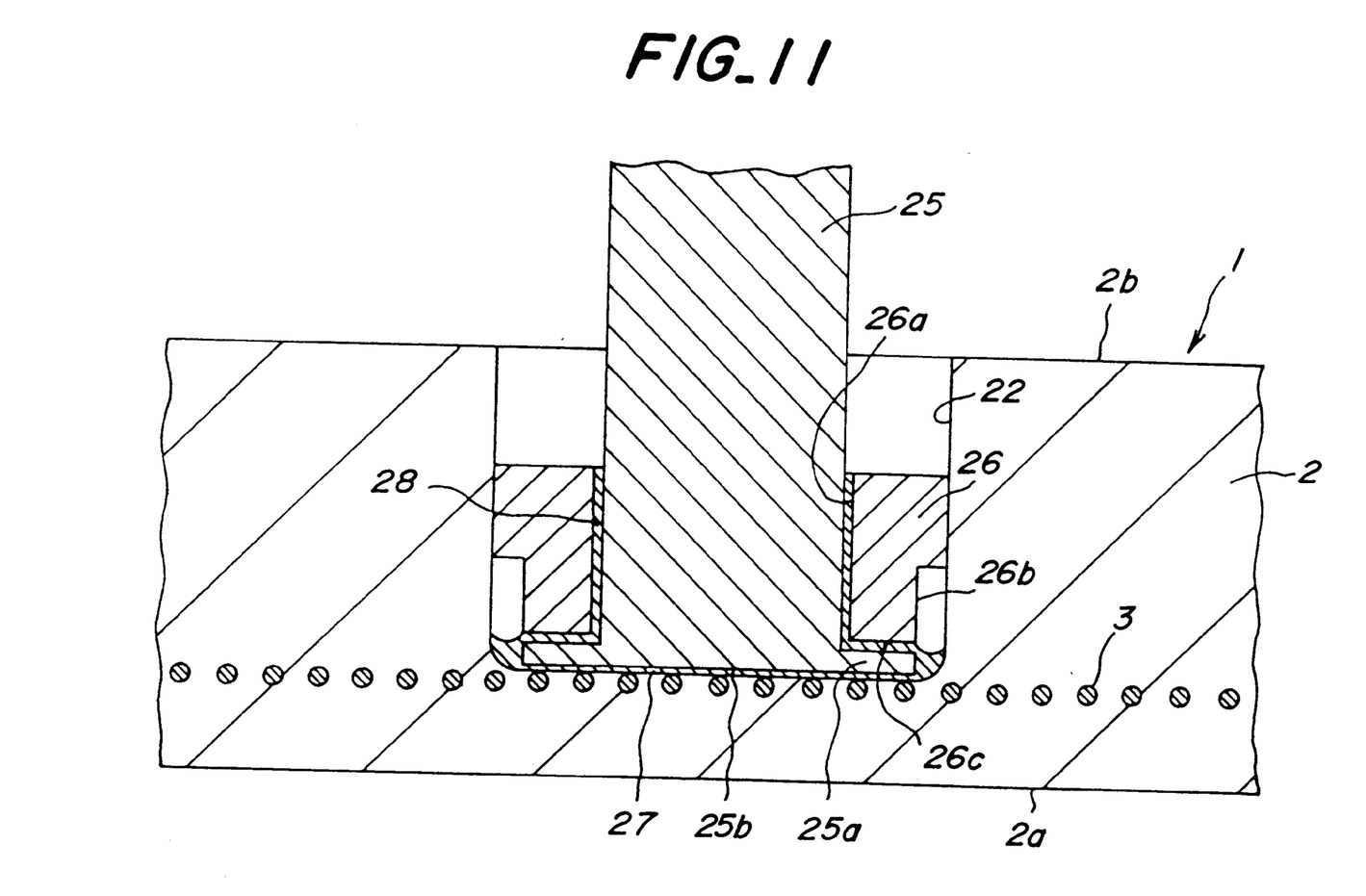
FIG. 11 is a sectional view of a ceramic member-electric power supply structure as a comparative example.

A coupling structure as shown in FIG. 11 was produced as a comparative example. First, a plasma generating electrode device 1 was prepared as in the invention example. Then, a 5 μm-thick titanium film was placed inside a hold 22, and a 200 μm-thick silver film was placed on the titanium film. Then, a flange portion 25a of a connector 25 made of nickel was placed on the silver plate, while a sheet of a brazing material was placed to contact a tip face 25b of the connector 25.

Next, an annular member 26 made of aluminum nitride was placed on the flange portion 25a of the connector 25 in the state that an inner peripheral face 26a of the annular member 26 was opposed to an outer peripheral face of the connector 25, while an under face 26c of the annular member 26 was opposed to the flange portion 25a. A gap 26b was provided around the outer peripheral face of the annular member 26.

A sheet of the brazing material having the composition mentioned before was placed between the inner peripheral face 26a of the annular member 26 and the outer peripheral face of the connector 25 and between the under face 26c of the annular member 26 and the flange portion 25a of the connector 25. The thus obtained assembly was thermally treated at 960° C. to 1000° C. for 10 minutes, thereby producing the coupling structure shown in FIG. 11. Reference numerals 27 and 28 denote conductive joining layers.

With respect to the thus obtained coupling structure, a tensile fracture load was measured to be 129±31 kgf (n=13), and a bending fracture torque measured to be 15±5 kgf.cm (n=3).

The joining strength was subjected to heat cycle between 100° C. and 700° C. 50 times under the condition that a heating rate and a cooling rate were both set at about 200° C./min, and then its tensile fracture load was measured to be 33±22 kgf (n=21). The bending fracture torque of the coupling structure after the heat cycle was measured to be 10±3 kgf·cm (n=3).

After a heat withstanding test in which the coupling structure was held at 700° C. for 24 hours, its tensile fracture load was measured to be 25±12 kgf (n=4), and its bending fracture torque measured to be 8±4 kgf·cm (n=3).

As is clear from the aforementioned explanation, according to the present invention, high joining strength and excellent conductive performance can be maintained in the coupling structure between the metallic member-buried ceramic member and the electric power supply connector, even if the coupling structure is subjected to high temperatures and heat cycle in the oxidative atmosphere.

What is claimed is:

1. A ceramic member-electric power supply connector coupling structure, comprising:
    a ceramic member including a hole;
    a metallic member provided in the ceramic member partially exposed to the hole;
    a generally tubular atmosphere-shielding member provided in the hole;
    a power supply connector partially positioned in the atmosphere-shielding member and tightly joined thereto;
    an heat expansion conductor in the atmosphere-shielding member between the power supply connector and the metallic member; and
    wherein the heat expansion conductor and the atmosphere-shielding member are tightly joined to the metallic member.

2. The coupling structure set forth in claim 1, wherein the tubular atmosphere-shielding member is gas tightly joined to the power supply connector by a brazing material, and the heat expansion conductor and the tubular atmosphere-shielding member are gas-tightly joined to the metallic member by the brazing material.

3. The coupling structure set forth in claim 1, wherein the heat expansion conductor is electrically joined to the power supply connector.

4. The coupling structure set forth in claim 1, wherein the heat expansion conductor comprises a material selected from the group consisting of molybdenum, tungsten, molybdenum-tungsten alloy, tungsten-copper-nickel alloy, and iron-cobalt-nickel alloy.

5. The coupling structure set forth in claim 1, wherein the atmosphere-shielding member is made of a metal selected from the group consisting of pure nickel, a nickel based heat-resistive alloy, gold, platinum, silver and alloys thereof.

6. The coupling structure set forth in claim 1, wherein the connector is made of a metal selected from the group consisting of pure nickel, nickel based heat alloy, gold, platinum, silver and alloys thereof.

7. The coupling structure set forth in claim 2, wherein a flange portion is formed at a upper outer peripheral face of the tip portion of the power supply connector, and an upper portion of the tubular atmosphere-shielding member is gas-tightly joined to the flange portion of the connector.

8. The coupling structure set forth in claim 2, wherein the substrate of the ceramic member is made of dense alumina or aluminum nitride, the brazing material is composed mainly of one metal selected from the group consisting of Cu, Ni, Ag and Al, and includes 0.3 to 20 wt % of an active metal selected from the group consisting of Mg, Ti, Zr and Hf and not more than 50 wt % of a third component selected from the group consisting of Si, Al, Cu and In.

9. The coupling structure set forth in claim 1, wherein the ceramic member comprises a susceptor for placing a semiconductor wafer thereon.

10. The coupling structure set forth in claim 9, wherein the metallic member is a planar metallic electrode, and the metallic electrode is electrically connected to the heat expansion conductor by a sintered shaped powdery body, said sintered shaped powdery body being buried in the ceramic member.

11. The coupling structure set forth in claim 9, wherein the metallic member comprises a metallic electrode electrically connected to the heat expansion conductor by a dense body made of a low heat expansion metal, said dense body being buried in the ceramic member.

12. A ceramic member-electric power supply connector coupling structure, comprising:
    a ceramic member including a hole;
    a metallic member provided in the ceramic member partially exposed to the hole;
    a generally tubular atmosphere-shielding member provided in the hole;
    a power supply connector partially positioned in the atmosphere-shielding member and tightly joined thereto with a brazing material;
    an heat expansion conductor in the atmosphere-shielding member;
    wherein the heat expansion conductor and the atmosphere-shielding member are tightly joined to the metallic member with the brazing material;
    the power supply connector comprises a flange portion at an upper outer peripheral face of the tip portion thereof; and
    the upper portion of the atmosphere-shielding member is gas-tightly joined to the flange portion of the power supply connector.

* * * * *